United States Patent [19]
Chauvin et al.

[11] Patent Number: 4,646,034
[45] Date of Patent: Feb. 24, 1987

[54] VERY HIGH FREQUENCY QUARTZ OSCILLATOR

[75] Inventors: Jacques Chauvin, Sartrouville; Patrice Canzian, Argenteuil, both of France

[73] Assignee: Compagnie d'Electronique et de Piezo-Electricite, Argenteuil, France

[21] Appl. No.: 659,891

[22] Filed: Oct. 11, 1984

[30] Foreign Application Priority Data

Oct. 14, 1983 [FR] France ................... 83 16384

[51] Int. Cl.$^4$ ........................................... H03B 5/36
[52] U.S. Cl. ............................. 331/116 R; 331/158; 331/177 V
[58] Field of Search ............ 331/116 R, 116 FE, 158, 331/117 D, 177 V

[56] References Cited

U.S. PATENT DOCUMENTS 2,683,810 7/1954 Mortley .................... 331/158
3,875,533 4/1975 Irwin et al. ................. 331/116 R
4,378,532 3/1983 Burgoon .................... 331/158

FOREIGN PATENT DOCUMENTS 1541561 7/1969 Fed. Rep. of Germany .
1475807 2/1967 France .
1473273 2/1967 France .

OTHER PUBLICATIONS

Microwave Journal, vol. 25, No. 2, Feb. 1982, S. Neylon: "Hybrid Saw Oscillators", pp. 91–93.
L'Onde Electrique, vol. 46, No. 466, Jan. 1966, P. Vovelle: "Une Nouvelle Application des Quartz: Les Oscillateurs a Frequence Controlee", pp. 105–110.

Primary Examiner—Siegfried H. Grimm
Attorney, Agent, or Firm—Oblon, Fisher, Spivak, McClelland & Maier

[57] ABSTRACT

The invention concerns a very high frequency quartz oscillator. The feedback loop of the oscillator comprises a compensation network of a quartz at the frequency of the oscillator, and a low-pass filter eliminating the frequencies lower than that of the oscillator. A power divider having two branches allows to send the signal issuing from the feedback loop, on the one hand, to the amplifier input of the oscillator and, on the other hand, to the output amplifier. Two-port networks $Q_1$ to $Q_6$ match the impedances at the input and at the output of the amplifier of the oscillator, of the feedback loop and of the output amplifier.

9 Claims, 13 Drawing Figures

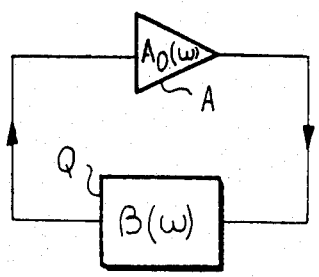
FIG_1
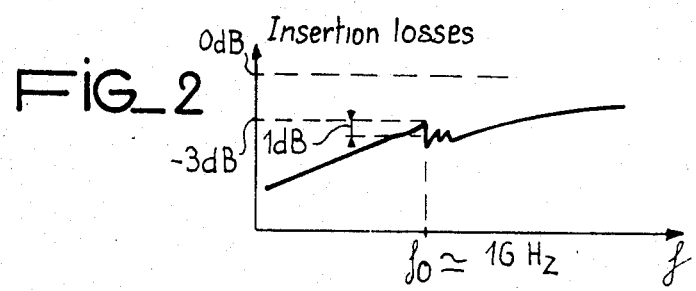
FIG_2
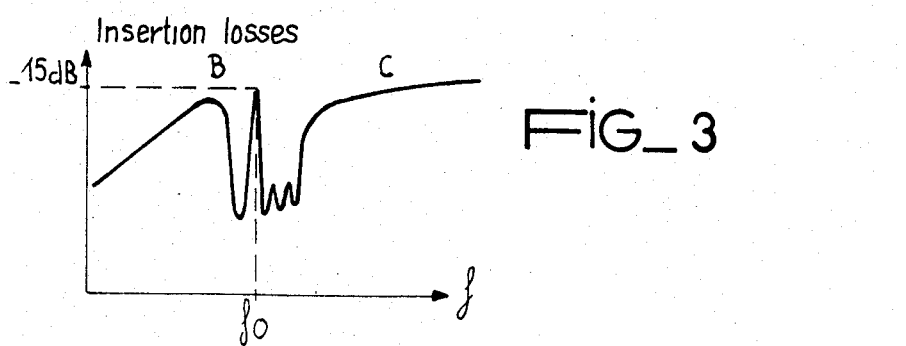
FIG_3
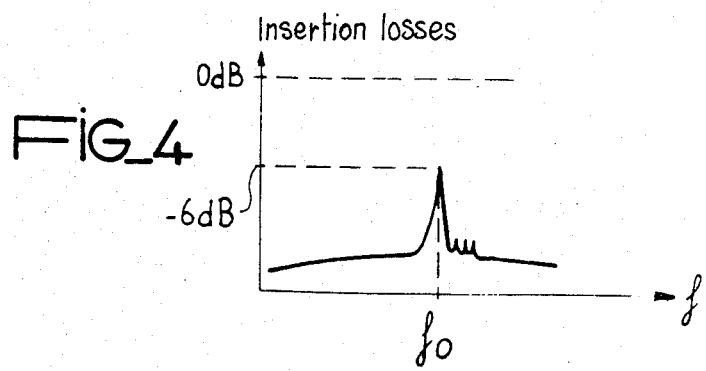
FIG_4

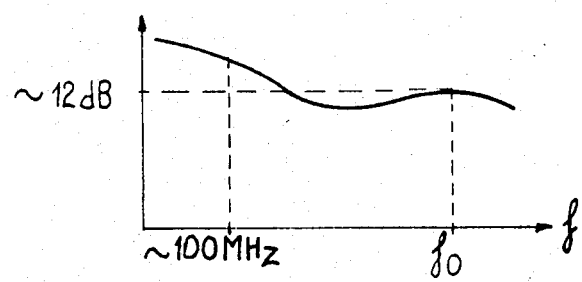
FIG_5
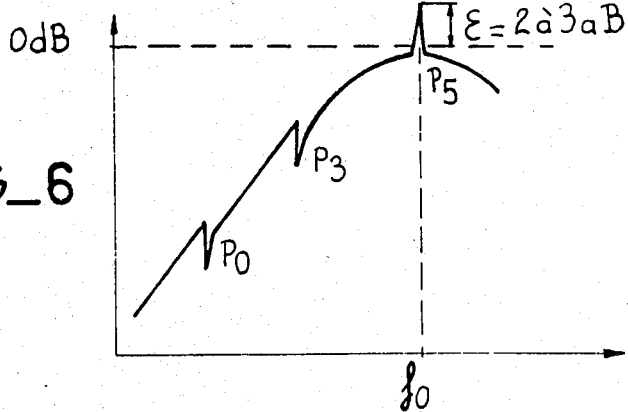
FIG_6
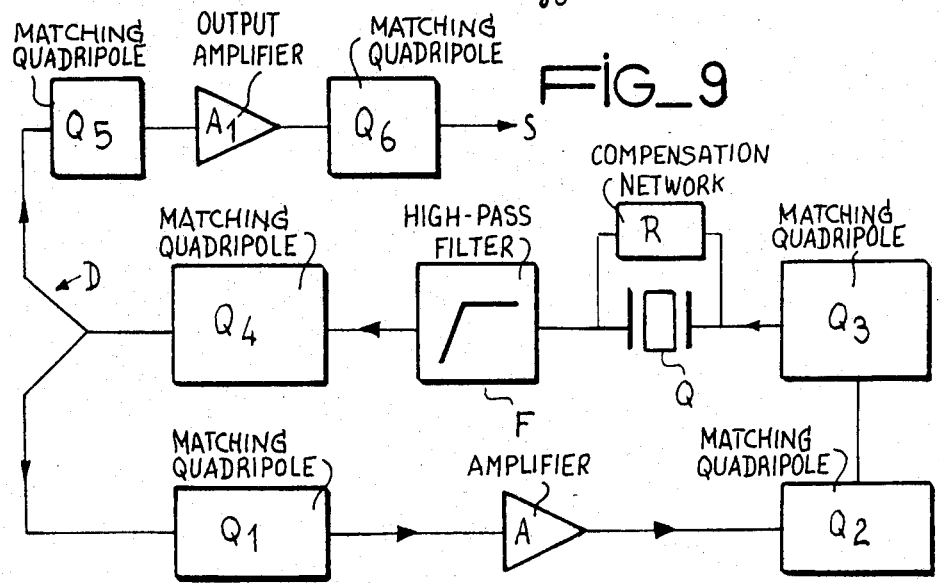
FIG_9

FIG_7-a
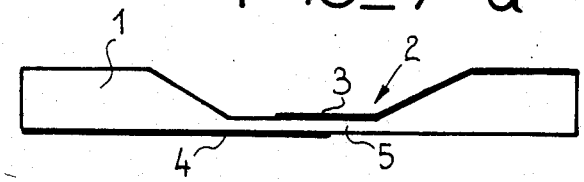
FIG_7-b
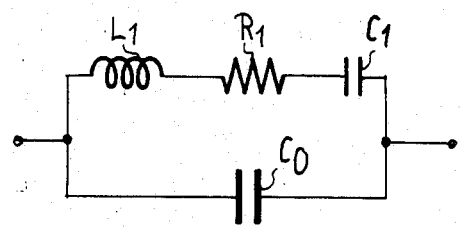
FIG_7-c
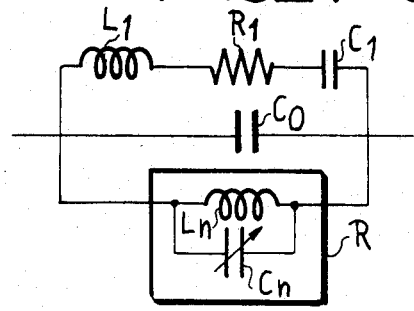
FIG_8
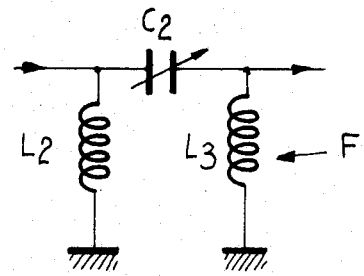

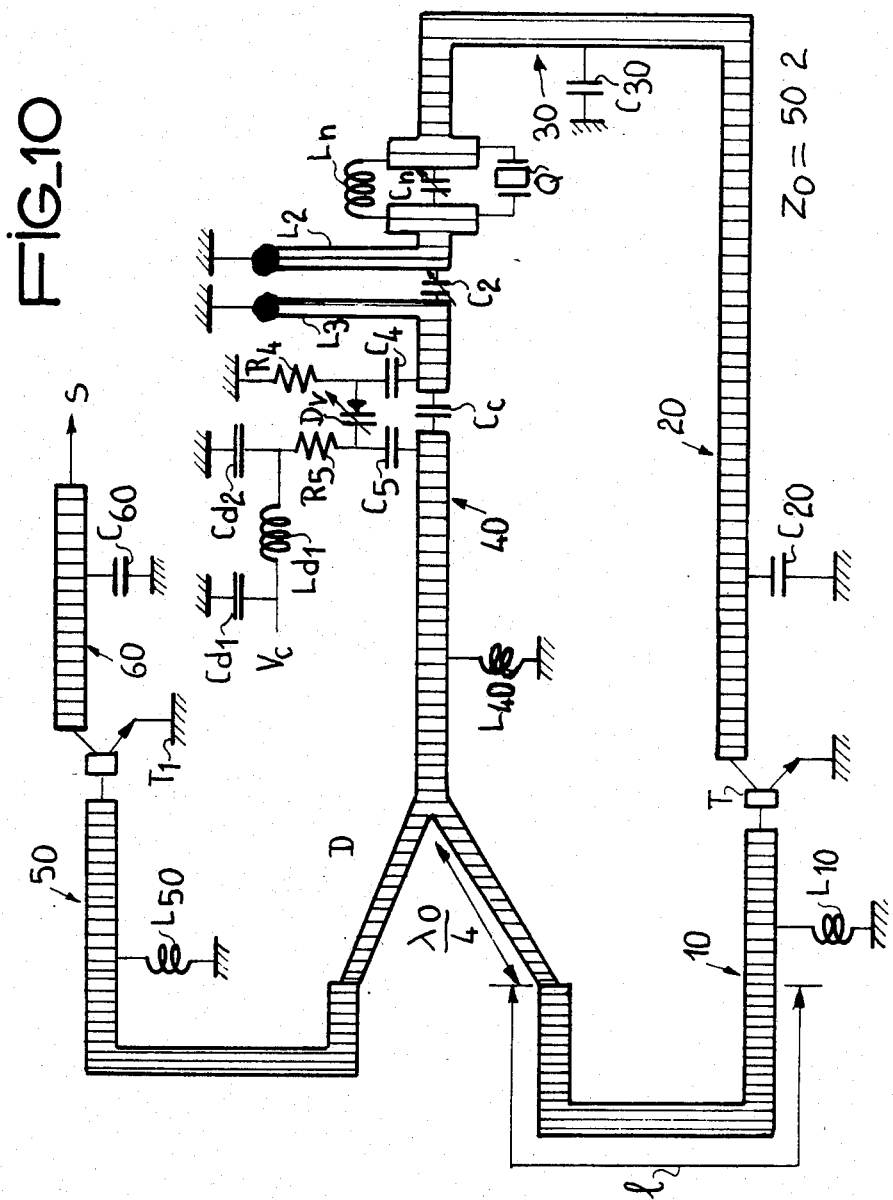

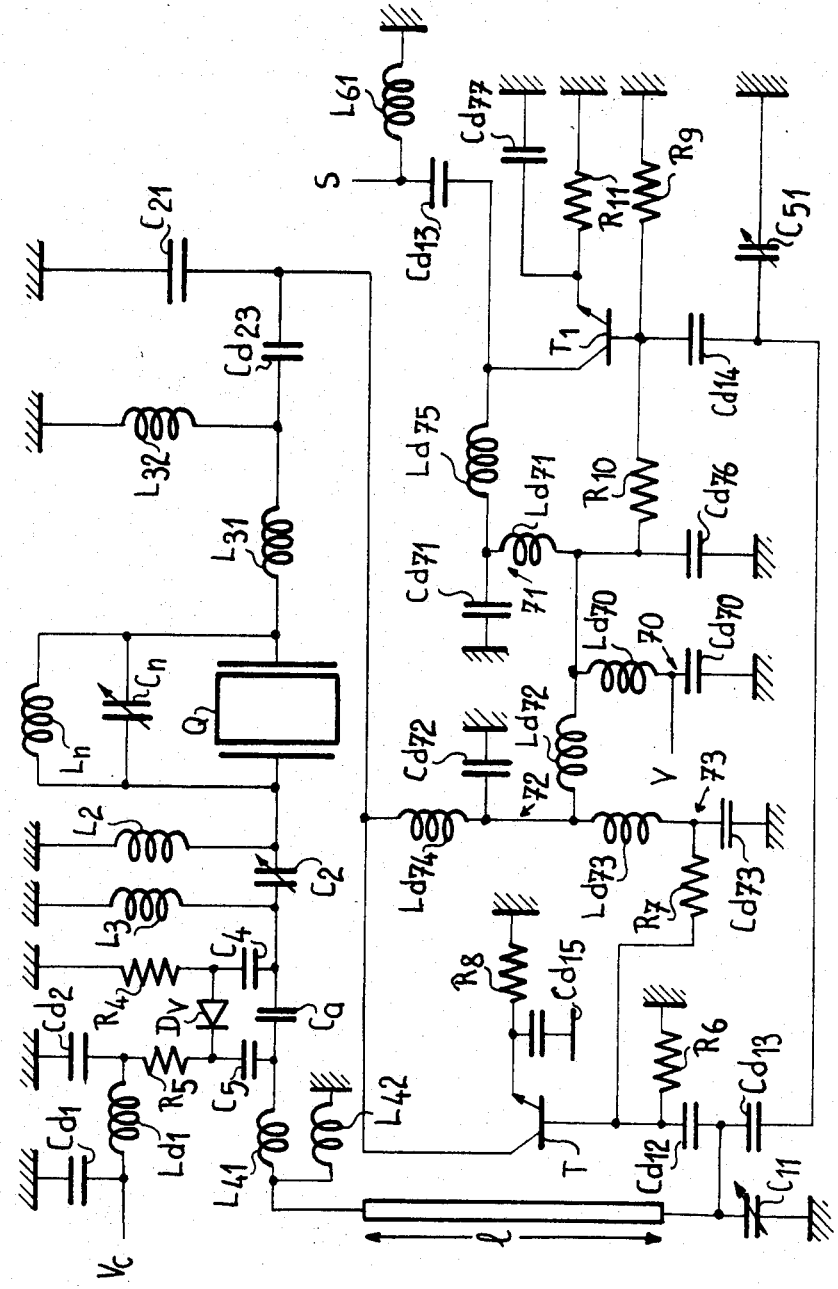
FIG_11

VERY HIGH FREQUENCY QUARTZ OSCILLATOR

FIELD OF THE INVENTION

The present invention concerns a very high frequency quartz oscillator, or VHF quartz oscillator.

DESCRIPTION OF THE PRIOR ART

It is known to obtain very high frequencies, in the GHz range, through multiplying the frequency of a quartz oscillator. However, although such a multiplying operation maintains more or less the quality factor of the oscillator, the signal/noise ratio is found to be impaired. If n is the frequency multiplication factor, the reduction of the signal/noise ratio, as expressed in decibels, is equal to 20×log n.

The problem to be solved, therefore, is to produce oscillators having the highest frequency possible directly.

The present invention provides a quartz oscillator electronic system which allows to reach frequencies at least equal to 1 GHz in direct frequency.

The oscillator according to the invention comprises an amplifier and a feedback loop including a quartz crystal, a given resonance frequency of which is selected to constitute the oscillator frequency. The amplifier has a gain such that when operating in an open loop, the Barkhausen gain condition is met. In this oscillator the quartz is compensated at the said frequency by a parallel circuit comprising at least one reactance coil, the feedback loop also comprising a filter which prevents frequencies lower than the said resonance frequency; the feedback loop is so designed that at the said resonance frequency, on the one hand, it is matched in impedance so that the compensation of the quartz is itself matched and, on the other hand, that it presents a phase shift equal to 0 modulo 2 $k\pi$; the said oscillator further comprises a power divider allowing to pick up part of the signal from the feedback loop in order to inject it into the output amplifier.

The amplifier is preferably a transistor mounted on a single emitter. Acording to an advantageous embodiment, the parallel circuit comprises a compensation capacitor, especially a variable capacitor.

According to another embodiment, the feedback loop comprises an electronic frequency tuning circuit. This tuning circuit may comprise a fixed capacitor mounted in series in the feedback loop and at the terminals of which is connected a Varicap diode supplied by a voltage control circuit.

The said filter which cuts frequencies lower than the resonance frequency advantageously comprises a $\pi$ filter including a variable series capacitor flanked by two reactance coils, one terminal of which is connected to the ground.

According to one embodiment, the oscillator is formed from line sections. It comprises discrete components distributed along the length of sections of lines of the loop so as to realize the impedance matching of the loop and the added length of the lines sections is such that the loop presents a phase shift equal to 0 modulo 2 $k\pi$. In the case where the filter mentioned herein-above is a $\pi$ filter, the two reactance coils can be lines sections shorter than one quarter of the wavelength of the oscillator frequency. The power divider can be a Wilkinson-type divider.

BRIEF DESCRIPTION OF THE DRAWINGS

The invention will be more clearly understood from reading the following description given by way of non-limitative example, with reference to the accompanying drawings in which:

FIG. 1 represents a block diagram of an oscillator;

FIG. 2 represents the response curve of a quartz having a resonance frequency close to 16 Hz;

FIG. 3 represents the response curve of the quartz after compensation according to the invention;

FIG. 4 represents the response curve of the quartz after compensation and matching according to the invention;

FIG. 5 represents the response curve of a hyperfrequency transistor mounted to form a common emitter;

FIG. 6 represents the response curve in open loop of the oscillator according to the invention;

FIGS. 7a and 7b represent a sectional view of a very high frequency quartz and the equivalent electric system;

FIG. 7c represents the equivalent electric wiring diagram of a compensated quartz according to the invention;

FIG. 8 represents a low-pass $\pi$ filter F; FIG. 9 represents a diagram of an oscillator according to the invention;

FIG. 10 represents an oscillator according to the invention in the form of a micro-tape line;

FIG. 11 represents an embodiment of an oscillator according to the invention making use of the discrete components.

DESCRIPTION OF THE PREFERRED EMBODIMENT

According to FIG. 1, an oscillator is comprised essentially of an amplifier A, presenting a gain $A_o(\omega)$, conected to a two-port network presenting a response curve $\beta(\omega)$. For the oscillator to operate, it is necessary that the product $A_o\beta$ be very slightly above 1 at the oscillator frequency. More precisely, the gain in open loop $A_o\beta$ expressed in decibels must be equal to about 2 to 3 decibels. This represents the Barkhausen gain condition. In order to overcome the necessity of using high gain amplifiers, the insertion losses of the quartz should be limited so that $\beta$ is as close as possible to 1.

Furthermore, it will be recalled that all oscillators pull into a frequency for which the total shift in open loop is zero modulo $2\pi$.

According to FIG. 2, a resonance peak of frequency $f_0$ very close to 1 GHz, corresponding to the partial 5 of a quartz, presents a weak dynamic of about 1 dB, with an insertion loss of $-3$ dB at the frequency $f_0$.

Such a response curve is totally unsuitable for the realization of a quartz oscillator, considering in particular the weak dynamic of the peak at frequency $f_o$. Due to this fact, the man skilled in the art has been dissuaded from realizing direct frequency oscillators in the GHz range.

FIGS. 7a and 7b represent such a UHF quartz in the form of a disk 1 in which has been hollowed out a basin 2 delimiting a thin membrane 5, the thickness of which is several microns, thus presenting a partial 5 of frequency $f_o$ close to 1 GHz. Each face of the membrane 5 bears an electrode, one of them 3 being situated in the basin 2, and the other 4 being situated on the lower face of the disk 1.

The equivalent representation of such a quartz comprises two parallel branches one comprising a reactance coil $L_1$, a resistor $R_1$, a capacitor $C_1$ in series, and the other a capacitor $C_o$. This capacitor is none other than the capacitor delimited by the portions of electrodes 3 and 4 which are opposite to each other in basin 2 and of which it constitutes the dielectric.

The applicant has observed that the low dynamic of the peak of frequency $f_o$ is essentially due to the fact that the capacitor $C_o$ practically short-circuits the quartz at frequency $f_o$.

According to the invention, a compensation is obtained at frequency $f_o$, allowing to eliminate the prejudicial influence of the capacitor $C_o$. To this end, a compensation coil $L_n$ is connected to the terminals of the quartz so as to realize a wave-trap circuit at frequency $f_o$ eliminating the prejudicial influence of $C_o$. Therefore:

$$L_n \times C_o \omega_o^2 = 1 \text{ with } \omega_o = 2\pi f_o$$

$\omega_o$ is defined by the relation:

$$L_1 \times C_1 \times \omega_o^2 = 1$$

In practice, it is also possible to connect to the terminals of the quartz the variable capacitor $C_n$ allowing to obtain perfect adjustment that must satisfy the relation:

$$L_n \times (C_n + C_o) \omega_0^2 = 1$$

This compensation allows to obtain a response curve whose aspect is given in FIG. 3. FIG. 3 shows that the dynamic of the frequency peak $f_o$ has considerably increased. On the other hand, the insertion loss has also increased to reach about 15 dB.

This peak $f_o$ is, furthermore, flanked by two lobes B and C that are practically at the same level. If such a quartz is introduced into the oscillator, its starting will have more chance of being carried out on undesirable frequencies corresponding to lobes B and C rather than on the frequency $f_o$. Indeed, the starting of an oscillator results from the background noise existing in the vicinity of the frequency of the oscillator. Lobes B and C interest a much wider frequency spectrum than peak $f_o$, and are, therefore, likely to pick up much more background noise, thereby ensuring starting of the oscillator.

According to the invention, the influence of the lobes B and C is eliminated by matching the impedances in the feedback loop. A response curve is thus obtained, the aspect of which is given in FIG. 4 where the peak $f_o$ presents a sufficient dynamic and where the insertion loss is furthermore reduced to about $-6$ dB. This value results in practice from a compromise since the matching does not necessarily occur on the impedance of the quartz itself for reasons that will be more precisely set out in the description herein-below.

According to FIG. 5, the gain curve of a UHF transistor mounted to form a common emitter presents a rise at about 100 MHz, a rise that is prejudicial since it may entail the saturation of the loop. With this in mind, a high-pass filter F is introduced, thereby attenuating the frequencies lower than $f_o$.

After compensation, impedance matching and filtration, the response curve of the oscillator has the aspect represented in FIG. 6. Only the resonance peak of the frequency $f_o$ corresponds to an open loop gain higher than 0 dB. The gain is indeed lower than 0 dB both for frequencies situated below $f_o$ under the effect of the high-pass filter F, and for frequencies higher than $f_o$ due to the fact that the transistor presents a cut-off frequency producing an attenuation of the frequencies higher than $f_o$. It goes without saying that if this attenuation produced by the transistor is not sufficient, the filter F can be completed in such a way as to make it act as a pass-band filter centered on $f_o$.

According to FIG. 9, the oscillator comprises an amplifier A which receives the output signal of a matching two-port network $Q_1$ and the output signals of that amplifier A are transmitted to a matching two-port network $Q_2$.

The feedback loop comprises a matching two-port network $Q_3$ downstream from $Q_2$, quartz Q with its compensation network R, high-pass filter F and a matching two-port network $Q_4$.

The output of the two-port network $Q_4$ is fed to a power divider D one branch of which reinjects the output signals of $Q_4$ at the input of $Q_1$ and the other branch of which directs a fraction of the output signals of $Q_4$ towards an output amplifier $A_1$ through the intermediary of a matching two-port network $Q_5$. The output signals of the output amplifier $A_1$ are directed towards output S by the intermediary of a matching two-port network $Q_6$.

It will be understood thereafter from the description that the matching two-port networks are line elements and/or discrete elements disposed in such a way as to realize an impedance matching. In the high frequencies field, the impedance matching is a standard technique. Such an operation is carried out, for example, by measuring through the use of a network analyser the input and output parameters (generally called S parameters) of each of the two-port networks prior to their matching, and by calculating the matching elements to be introduced into the two-port network concerned.

Such calculating formulae are given in the work of P. GRIVET called "Physique des lignes de HF et d'UHF", volume 2, "Circuits et amplis microondes" edited by MASSON and COMPANY.

FIG. 8 represents an embodiment of the filter F in the form of a $\pi$ filter comprising a variable capacitance $C_2$ flanked by two reactance coils, respectively $L_2$ and $L_3$ of which one terminal is connected to the ground.

According to FIG. 10, the oscillator is realized in 50 ohms microtape technology. The polarization of the transistor T and $T_1$, has not been represented. It can be realized as illustrated in FIG. 11. The amplifier A is constituted by a THOMSON-CSF BFP-type transistor T. It is mounted to form a common emitter amplifier.

At operating frequency, the impedance matching at the input and at the output of the transistor T is carried out by a line length and a discrete component. Therefore, the matching at the input of the transistor T is realized by a line length 10 and a matching coil connected to the ground $L_{10}$. The line length 10 and the coil $L_{10}$ constitute the two-port network $Q_1$ of FIG. 9. In the same way, the matching at the output of the transistor T is carried out by a line length 20 and a capacitor $C_{20}$ connected to the ground, constituting the two-port network $Q_2$.

The matching to the input of the feedback loop is realized by a line length 30 and a capacitor connected to the ground $C_{30}$ constituting the two-port network $Q_3$. At the output of the negative feedback loop, the matching is realized by a line length 40 and a coil connected to the ground $L_{40}$ constituting the two-port network $Q_4$.

It will be noted that the components mentioned in FIG. 10 are only given by way of example. Indeed, each of the two-port networks use as matching element a coil or a capacitor according to the results given by the measurements taken using a network analyser. Furthermore, the results can be such that for one or several two-port networks, there is no need to utilize a matching element.

The line length 40 issues into a Wilkinson-type divider D comprising two branches forming a Y, each of the branches having a length equal to $\lambda_o/4$ where $\lambda_o$ is the wavelength corresponding to frequency $f_o$. Such a divider can be calculated by the method indicated in the article N. Way Hybrid Power Divider, which appeared in the journal IEE Microwave No. 1 1969 in the name of Ernest Wilkinson.

One of the branches of the divider D issues onto a line length 1 of which the length will be chosen in such a way that, at the frequency $f_o$, the Barkhausen phase condition is met, i.e. the shift of the loop is thus equal to 0 modulo $2k\pi$.

The end of the other branch of the Wilkinson divider issues in a line 50 that is connected to an output transistor $T_1$ of the same type as the transistor $T$ and also mounted to form a common-emitter amplifier. At the input, the transistor is matched by line length 50 to which is joined a coil $L_{50}$ to the ground constituting the two-port network $Q_5$, and at the output by a line length 60 and a capacitor to the ground $C_{50}$, constituting the two-port network $Q_6$. The end of line 60 constitutes the output S of the oscillator.

The realization of the response curve of FIG. 4 requires, as emphasized herein-above taking certain precautions at the level of impedance matching at the input and at the output of the quartz Q. If $R_2$ designates the impedance seen by the quartz upstream and $R_3$ the impedance seen by the quartz downstream, the quality factor Q at the frequency $f_o$ of the quartz can be expressed as:

$$Q = L_1\omega_o/(R_1 + R_2 + R_3)$$

This means that, if the impedance seen by the quartz increases, the quality factor Q of the quartz decreases. On the other hand the insertion losses decrease.

One acceptable compromise consists in $R_2$ being equal to $R_3 = R_1/2$.

This compromise, which corresponds to an approximate matching, leads to an insertion loss that is not too high (about 6 db) and a reduction of the quality factor Q of a ratio of only 2.

In the case where it is desired to slightly vary the frequency of the oscillator, this function can be realized by using an electronic frequency tuning circuit. This comprises a fixed capacitor $C_c$ in series in the feedback loop at the terminal of which is connected the tuning circuit per se, comprising a Varicap diode $D_v$ of which the two terminals are connected to the terminals of the capacitor $C_c$ through the intermediary of two capacitors, respectively $C_4$ and $C_5$. The (+) terminal of the Varicap diode $D_v$ is connected to the ground through the intermediary of a polarization resistance $R_4$. The (−) terminal of the Varicap diode $D_v$ receives a control voltage $V_c$ through a resistance $R_5$. The control voltage $V_c$ is decoupled by a suppressor choke $L_{d1}$ connected in series between the resistance $R_5$ and the variable voltage supply $V_c$. At the terminals of the coil $L_{d1}$, are mounted one of the terminals of the two decoupling capacitors $C_{d1}$, $C_{d2}$ the other terminal of which is connected to the ground.

The variation of the value of the capacity of the Varicap diode $D_v$ has the effect of causing to vary slightly the displacement produced by the feedback loop. It is no longer zero modulo $2\pi$ at frequency $f_o$, but at a frequency $f'_o$ very close and situated on the peak $f_o$, and which due to this fact becomes the frequency of the oscillator. Any variation of $V_c$, for example, by a potentiometric divider, causes $f'_o$ to vary.

FIG. 11 represents a realization in discrete or concealed components technology.

A matching capacitor $C_{21}$ is connected between the collector of transistor T and the ground. This capacitance $C_{21}$ constitutes the matching element of two-port network $Q_2$.

The two-port network $Q_3$ is matched, due to a series coil $L_{31}$ and a parallel coil $L_{32}$ of which one terminal is connected to the ground.

Between the two two-port networks, is interposed a decoupling capacitor $C_{d23}$ which has the function of eliminating the direct current of the loop. The two-port network $Q_4$ is matched through the use of a series coil $L_{41}$ and a parallel coil $L_{42}$ of which one terminal is connected to the ground.

This wiring diagram still needs the presence of a line length 1 realized in the present case by a 50 ohms coaxial line. Indeed, a transistor mounted to form common emitter assembly shifts the phase by 180°, thereby necessitating introduction of a supplementary phase shifter, especially to respect the Berkhausen phase condition at frequency $f_o$.

The matching element of the two-port network $Q_1$ at the input of the transistor T is constituted by a variable capacitor $C_{11}$ connected between the output of the coaxial line of length 1 and the ground. The input of the base of transistor T is decoupled by a decoupling capacitor $C_{d12}$ in series. The emitter of the transistor T is charged by a resistance $R_8$ and decoupled by a decoupling capacitance $C_{d15}$ connected between the emitter of $T_1$ and the ground.

The picking up of the output signal is realized simply through the intermediary of a decoupling capacitor $C_{d13}$, i.e. the two transistors T and $T_1$ are supplied in parallel from the output of the coaxial line of length 1 without any precaution other than the impedance matching of the two-port networks $Q_5$ realized by a variable capacitor $C_{51}$ connected between the ground and the base of transistor $T_1$, upstream of a decoupling capacitor $C_{d14}$.

The output S of transistor $T_1$ is matched by a parallel coil $L_{61}$ of which one terminal is connected to the ground (two-port network $Q_6$); the direct currents being possibly present at the output of the collector of the transistor $Q_1$ are decoupled by a decoupling capacitor $C_{d13}$.

The emitter of the transistor $T_1$ is charged by a resistance $R_{11}$ and decoupled by a decoupling capacitor $C_{d77}$ connected between the emitter of $T_1$ and the ground.

The polarization of transistors T and $T_1$ is carried out from a decoupled voltage V, especially by a series of four cells 70 to 73, each comprising a suppressor choke $L_d$ (referenced 70 to 73) disposed in series, and a decoupling capacitor $C_D$ (referenced 70 to 73) mounted in parallel and of which one terminal is connected to the ground.

The first cell 70 receives the voltage V at a first terminal of its associated coil $L_{d70}$ of which the second terminal is connected to one end of a resistive divider bridge $R_9$, $R_{10}$, the middle bridge of which is connected to the base of the transistor $T_1$. Between $R_{10}$ and the ground, is also connected a decoupling capacitor $C_{d76}$. The second terminal of the coil $L_{d70}$ sends its output signal to a cell 71 of which the coil $L_{d71}$ is connected to the collector of transistor $T_1$ by a coil $L_{d75}$. It also sends its output signal to a cell 72 of which the coil $L_{d72}$ is connected to the collector of the transistor T by the intermediary of a coil $L_{d74}$, as well as to a cell 73 of which the coil $L_{d73}$ is connected to one end of a resistive divider bridge $R_6$, $R_7$ of which the middle bridge is connected to the base of transistor T.

By way of example, the suppressor chokes utilized for the decoupling have a value of 1μH and the decoupling capacitors a value of 1nF. With respect to the Varicap diode $D_v$, it can have a nominal value of 30 pF, and it is assumed that $C_4 = C_5 = 2.2$ pF and $R_4 = R_5 = 10$kΩ. The values of the other elements result from the calculations indicated herein-above, in particular with respect to the impedance matches. It will be noted that these latter depend not only upon the quartz utilized but also upon the transistor utilized. In fact, two transistors even issuing from the same series do not present exactly the same characteristics. Furthermore, it should be noted that a quartz resonating in the GHz range presents at this frequency a characteristic impedance (resistance $R_1$) of about 400Ω.

The present invention is not limited to the embodiments described and represented herein-above. In particular, the elements of the feedback loop (quartz, filter and eventually electronic tuning frequency) can be disposed in any order. Furthermore, the picking up of the output signal by a power divider, which can be of any known type, can be realized at any point in the loop. Similarly, the power divider can be replaced by a directional coupler.

We claim:

1. A very high frequency quartz oscillator having a direct frequency of at least one GHz, comprising an amplifier and a feedback loop including a quartz crystal, the given resonance frequency of which is selected to constitute the oscillator frequency, the amplifier having a gain such that when operating in an open loop, the Barkhausen gain condition is met, and the quartz crystal being compensated at the said frequency ($f_o$) by a parallel circuit comprising at least an inductor, the feedback loop also comprising a filter connected in series which prevents frequencies lower than the said resonance frequency ($f_o$), the amplifier being a transistor mounted to form a common emitter circuit with said filter, wherein the feedback loop is so designed that at the said resonance frequency, on the one hand, said feedback loop is impedance matched so that the combination of the quartz crystal and compensating parallel circuit is also impedance matched and, on the other hand, that it presents a phase shift equal to 0 modulo $2k\pi$, and wherein the said oscillator further comprises a power divider for dividing part of the signal of the feedback loop in order to inject it into an output amplifier.

2. Oscillator according to claim 1, wherein said parallel circuit also comprises a compensation capacitor.

3. Oscillator according to claim 2, wherein the compensation capacitor is a variable capacitor.

4. Oscillator according to claim 1, wherein the feedback loop comprises an electronic frequency tuning circuit.

5. Oscillator according to claim 4, wherein the said electronic frequency tuning circuit comprises a fixed capacitor in series in the feedback loop, and at the terminals of which is connected a Varicap diode $D_v$ supplied by a voltage control circuit.

6. Oscillator according to claim 1, wherein the said filter comprises a $\pi$ filter comprising a variable series capacitor connected on each end to one end of a reactance coil, the other terminal of each coil being connected to ground.

7. Oscillator according to claim 1, wherein it is realized in stripline form and comprises discrete components distributed along the length of line sections of the loop so as to realize impedance matching in the loop and wherein the total length of the line sections is such that the loop presents said phase shift equal to 0 modulo $2k\pi$.

8. Oscillator according to claim 1, wherein the said filter comprises a $\pi$ filter including a variable series capacitor connected on each end to one end of a line section of length smaller than one quarter the wavelength of the said frequency of the oscillator.

9. Oscillator according to claim 7, wherein the power divider is a Wilkinson type quarter wavelength power divider.

* * * * *